310-369
3/24/87 XR 4,652,785
SR

United States Patent [19]
Gabriel et al.
[11] Patent Number: 4,652,785
[45] Date of Patent: Mar. 24, 1987

[54] ACOUSTIC PIEZOELECTRIC POWER TRANSDUCER

[75] Inventors: Karel Gabriel, Pilsen; Frantisek Smolik, Strasice; Eduard Steif, Pilsen; Vaclav Sabek, Vejprnice, all of Czechoslovakia

[73] Assignee: Skoda, koncernovy podnik, Pilsen, Czechoslovakia

[21] Appl. No.: 820,954

[22] Filed: Jan. 21, 1986

Related U.S. Application Data

[63] Continuation-in-part of Ser. No. 652,173, Sep. 18, 1984, abandoned.

[30] Foreign Application Priority Data

Sep. 20, 1983 [CS] Czechoslovakia .................... 6848-83

[51] Int. Cl.[4] .............................................. H01L 41/08

[52] U.S. Cl. .................................... 310/325; 310/365; 310/369

[58] Field of Search ............... 310/323, 325, 334, 338, 310/363, 365, 332, 353, 367, 368, 369

[56] References Cited

U.S. PATENT DOCUMENTS

| | | | |
|---|---|---|---|
| 3,140,859 | 7/1964 | Scarpa | 310/325 X |
| 3,179,826 | 4/1965 | Trott et al. | 310/363 |
| 3,183,378 | 5/1965 | McCracken et al. | 310/325 |
| 3,368,086 | 2/1968 | Libby | 310/325 |
| 4,601,210 | 7/1986 | Brown | 310/336 X |

*Primary Examiner*—Mark O. Budd

[57] ABSTRACT

An acoustic piezoelectric power transducer of sandwich shape with supply conductors pressed into grooves in the electrically conductive metal inserts and/or the piezoelectric plates.

3 Claims, 6 Drawing Figures

ACOUSTIC PIEZOELECTRIC POWER TRANSDUCER

This application is a continuation-in-part of our application Ser. No. 652,173 filed Sept. 18, 1984, now abandoned.

BACKGROUND OF THE INVENTION

The invention relates to an acoustic piezoelectric power transducer of sandwich shape.

A number of constructional arrangements of acoustic piezoelectric power transducers are known wherein the means of connecting supply conductors is either effected by means of a screw or by soldering. Screw connections of supply conductors are disclosed, for example, in U.S. Pat. Nos. 3,140,859 and 3,772,538 as well as in British patent specification No. 1,189,184, consist in that the conductors provided with cable lugs are screwed onto the corresponding metallic supply parts of the transducer. These connections have the drawback that they substantially increase the mechanical loss of the transducer and also have a short life span due to the mechanical fatigue of the connection. Soldering connections of supply conductors do not substantially increase the mechanical loss of the transducer but they do have a relatively short life span. As disclosed in U.S. Pat. Nos. 3,066,232 and 3,329,408, the supply conductors are soldered, as a rule, onto risers of relatively thin electroconductive metallic inserts.

SUMMARY OF THE INVENTION

It is an object of the present invention to provide an arrangement of supply conductors of acoustic piezoelectric power transducers which would be rigid, reliable, and which would not increase mechanical loss of the transducer to any high degree while at the same time increasing the life span of the connection.

According to the present invention, a part of the supply conductor is pressed into a groove of an electrically conductive metal insert and/or a piezoelectric plate.

By arranging the supply conductors of an acoustic piezoelectric power transducer in sandwich shape, the present invention practically eliminates additional mechanical losses due to the connection of the supply conductors and thereby achieves increased effectiveness and life span of the device.

BRIEF DESCRIPTION OF THE DRAWINGS

With these and other objects in view, which will become apparent in the following detailed description, the present invention, which is shown by example only, will be clearly understood in connection with the accompanying drawing, wherein.

DETAILED DESCRIPTION

Figure 1:
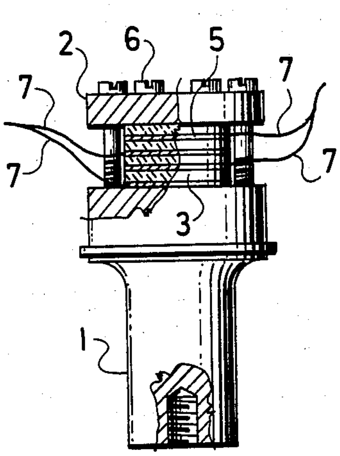
FIG. 1 is a sectional elevation of an acoustic piezoelectric transducer of sandwich shape with circumferential clamping screws.

The acoustic piezoelectric power transducer as shown in FIG. 1 comprises a first acoustic element 1 having the shape of a staggered cylinder, and a second acoustic element 2 having the shape of a circular plate. Between the two elements there are situated two pairs of piezoelectric plates 3 together with third acoustic metal elements 5 having the shape of a thin circular plate.

Figure 2:
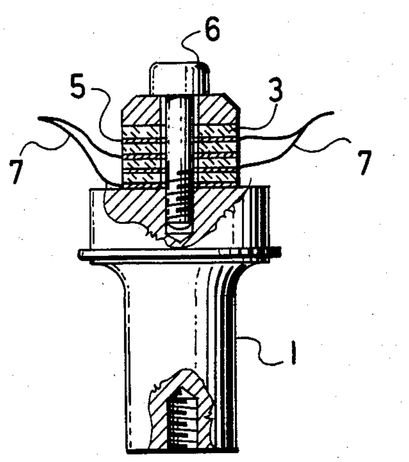
FIG. 2 is a sectional elevation of an acoustic piezoelectric transducer of sandwich shape with a central clamping screw.

The third acoustic elements 5 are always arranged so that they follow the piezoelectric plate 3, and their flat contact surfaces are provided with a groove 4 into which a supply conductor 7 having a low acoustic conductivity is pressed. All of the contact surfaces are connected with one another by clamping elements 6 which unite said surfaces including the supply conductor 7 into a single integer and provide a necessary mechanical pre-stress of the piezoelectric plates 3 for operating of the transducer at relatively large amplitudes. FIG. 2 shows the same acoustic piezoelectric power transducer as shown in FIG. 1. The only difference therebetween consists in that it comprises only one clamping means 6 situated along the longitudinal transducer axis.

Figure 3:
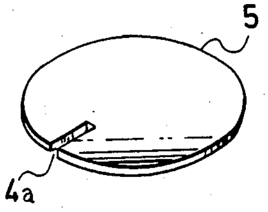
FIGS. 3 and 4 show arrangements of a groove in electrically conductive metal inserts.
Figure 4:
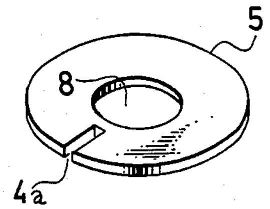

FIGS. 3 and 4 show an embodiment wherein the grooves 4 in the flat contact surfaces of the third acoustic elements 5 are situated in another way. Moreover the third acoustic element 5 shown in FIG. 4 has a hole 8 for the clamping means 6.

Figure 5:
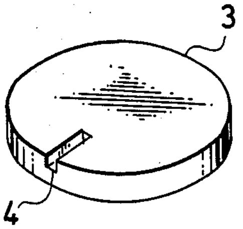
FIGS. 5 and 6 show the arrangements of a groove in piezoelectric plates.
Figure 6:
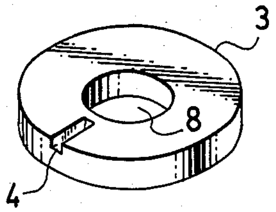

FIGS. 5 and 6 show another embodiment of the situation of the grooves 4 in the flat contact surface of the piezoelectric plate 3. The latter shown in FIG. 6 has also an additional hole 8 for the clamping means 6.

It is apparent from the above-mentioned figures that the part of the supply conductors 7 can be pressed either in the groove 4 of the piezoelectric plate 3, or in the groove 4*a* of the third acoustic element 5. If necessary, the grooves 4 and 4*a* can be provided both either in the acoustic elements 1, 2, and 5, or in the piezoelectric plate 3, always in the flat contact surfaces thereof. Provided the piezoelectric plates 3 on the contact surfaces are metal-plated, it is advisable to omit the third acoustic element 5 and to press the part of the supply conductor 7 into the groove 4 made in the metal-plated surface of the piezoelectric plate 3.

We claim:

1. An acoustic transducer, comprising at least two acoustic elements having a flat contact surface, piezoelectric elements interposed between said acoustic elements and consisting of at least one pair of piezoelectric plates having flat surfaces to bear on the surfaces of the acoustic elements, said piezoelectric plates being provided on the flat contact surface with a groove into which a part of a supply conductor is inserted and compressed, said conductor having a low acoustic conductivity, clamping means for uniting by their pressure all of the said contact surfaces including said part of the supply conductor into one integer, and for giving the piezoelectric plates a necessary mechanical prestress for transducer operation at large amplitudes.

2. An acoustic transducer are claimed in claim 1, wherein at least one of said acoustic elements is provided on its contact surface bearing on the contact surface of said piezoelectric plate, with a groove into which a part of the supply conductor is inserted and compressed.

3. An acoustic transducer, comprising at least two acoustic elements having a flat contact surface, piezoelectric elements interposed between said acoustic elements and consisting of at least one pair of piezoelectric plates having flat surfaces to bear on surfaces of said acoustic elements, said acoustic elements being provided on their contact surfaces bearing contact surfaces of the piezoelectric plates, with a groove into which a part of the supply conductor is inserted and compressed, said conductor having a low acoustic conductivity, clamping means for uniting by their pressure all of said contact surfaces including the part of supply conductor into one integer, and for giving the piezoelectric plates a mechanical prestress necessary for transducer operation at large amplitudes.

* * * * *